United States Patent [19]
Mizuguchi et al.

[11] Patent Number: 6,114,796
[45] Date of Patent: Sep. 5, 2000

[54] PIEZOELECTRIC RESONATOR, METHOD FOR ADJUSTING FREQUENCY OF PIEZOELECTRIC RESONATOR AND COMMUNICATION APPARATUS INCLUDING SAME

[75] Inventors: Takashi Mizuguchi, Shiga-ken; Takeshi Yamazaki, Ishikawa-ken; Kiyoshi Iyama, Himi, all of Japan

[73] Assignee: Murata Manufacturing Co., LTD, Kyoto, Japan

[21] Appl. No.: 09/160,656

[22] Filed: Sep. 25, 1998

[30] Foreign Application Priority Data

Oct. 1, 1997 [JP] Japan .................................... 9-286179
Sep. 1, 1998 [JP] Japan .................................... 10-247204

[51] Int. Cl.$^7$ .................................................. H01L 41/04
[52] U.S. Cl. ................................................... 310/312
[58] Field of Search .................................... 310/312, 366

[56] References Cited

U.S. PATENT DOCUMENTS

| | | | |
|---|---|---|---|
| 3,544,926 | 12/1970 | Hurtig | 310/312 |
| 3,760,471 | 9/1973 | Borner | 29/25.35 |
| 4,211,947 | 7/1980 | Ikeno et al. | 310/312 |
| 4,262,227 | 4/1981 | Ikeno et al. | 310/312 |
| 4,447,753 | 5/1984 | Ochiai | 310/312 |
| 4,484,382 | 11/1984 | Kawashima | 29/25.35 |
| 5,939,819 | 8/1999 | Unami et al. | 310/366 |

FOREIGN PATENT DOCUMENTS

| | | |
|---|---|---|
| 58-006616 | 1/1983 | Japan . |
| 7-106892 | 4/1995 | Japan . |

*Primary Examiner*—Nestor Ramirez
*Assistant Examiner*—Peter Medley
*Attorney, Agent, or Firm*—Joseph R. Keating, Esq.; Keating & Bennett, LLP

[57] ABSTRACT

A piezoelectric resonator includes a base member in which piezoelectric layers and internal electrodes are laminated. At one side surface of the base member, the internal electrodes are alternately covered with a first insulating film and with a second film, and first and second external electrodes are disposed thereon alternately connecting the internal electrodes to the first and second external electrodes. An additional material is disposed on the side surface of the base member opposite from the side surface on which the external electrodes are formed by applying ink via an ink jet printer or the like. The additional material is disposed at the opposite ends of the base member in the longitudinal direction. A metal film may also be disposed at a central portion of the base member by a thick film forming method.

9 Claims, 9 Drawing Sheets

PIEZOELECTRIC RESONATOR, METHOD FOR ADJUSTING FREQUENCY OF PIEZOELECTRIC RESONATOR AND COMMUNICATION APPARATUS INCLUDING SAME

BACKGROUND OF THE INVENTION

1. Field of the Invention

The present invention relates to a piezoelectric resonator, a method for adjusting a frequency of the piezoelectric resonator and a communication apparatus and, more particularly, to a piezoelectric resonator in which mechanical vibration of a piezoelectric member is utilized and which piezoelectric resonator is incorporated in an electronic component such as an oscillator, a discriminator or a filter.

2. Description of the Related Art

Figure 11:
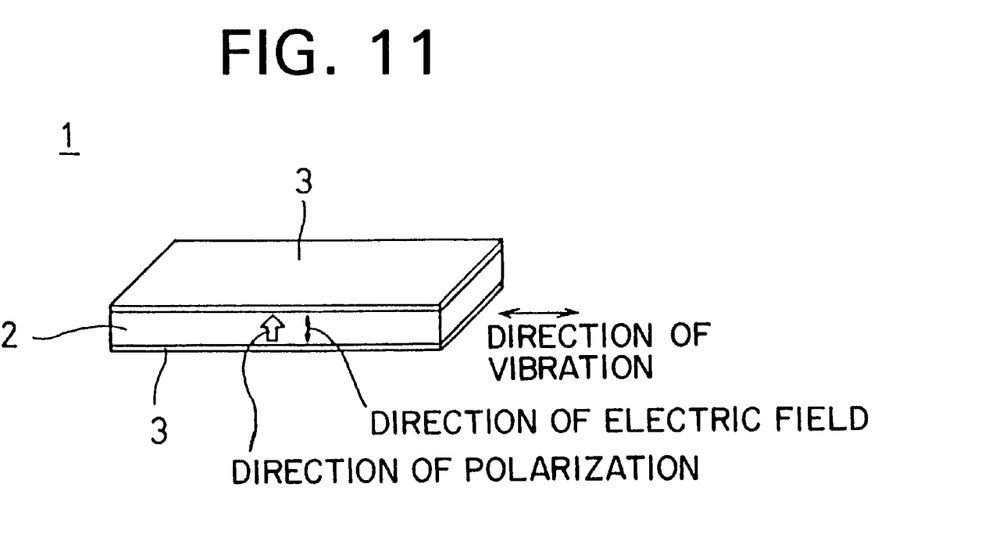
FIG. 11 is a perspective view of an example of a conventional piezoelectric resonator.

A conventional piezoelectric resonator, e.g., a piezoelectric resonator 1 such as that shown in FIG. 11, has a base member 2 having a rectangular plate shape and formed of a piezoelectric material, and electrodes 3 provided on the two major surfaces of the base member 2. In the piezoelectric resonator 1, the base member 2 is polarized in the direction of thickness, and a signal is input between the electrodes 3 to excite longitudinal vibration in the base member 2. The piezoelectric resonator 1 arranged in this manner is an unstiffened type in which the direction of polarization and the direction of the electric field differ from the direction of vibration.

A frequency adjustment method for such a piezoelectric resonator is disclosed in Japanese Patent Laid-Open Publication No. 204778/1994. In the method disclosed in this publication, the fact that a resonant frequency of longitudinal vibration is determined by the longitudinal size of a piezoelectric resonator is taken into consideration, and an end surface portion of a piezoelectric resonator is removed to change the longitudinal size of the piezoelectric resonator, thereby adjustably increasing the frequency.

However, if a piezoelectric resonator in which longitudinal vibration is excited is cut for frequency adjustment, stress and frictional heat at the time of cutting negatively influence the piezoelectric resonator. In particular, there is a need to completely recover and remove chips or small particles generated by cutting because piezoelectric materials ordinarily used for piezoelectric resonators contain Pb. This kind of frequency adjustment method also causes negative influences upon other characteristics including the capacitance since portions of the piezoelectric material and the electrodes are removed. In adjusting the frequency by cutting a piezoelectric resonator, it is difficult to control the amount of cutting. Further, the method of cutting an end surface of a piezoelectric resonator does not allow adjustment to reduce the frequency, but only allows adjustment to increase the frequency.

SUMMARY OF THE INVENTION

To avoid the problems with the prior art described above, the preferred embodiments of the present invention provide a piezoelectric resonator which is easily and accurately frequency-adjusted without influencing characteristics other than the resonant frequency.

The preferred embodiments of the present invention provide a method for adjusting a frequency of a piezoelectric resonator which makes it possible to easily increase or decrease a frequency characteristic without generating harmful materials or causing detrimental effects on other resonator characteristics.

The preferred embodiments of the present invention also provide a communication apparatus including a piezoelectric resonator which is easily and accurately frequency-adjusted without influencing characteristics other than the resonant frequency.

According to a preferred embodiment of the present invention, a method for adjusting a frequency of a piezoelectric resonator includes the steps of providing a piezoelectric resonator which vibrates in a longitudinal vibration mode and includes a base member having a longitudinal direction, and adjusting a frequency of the piezoelectric resonator by disposing an additional material on the base member and by adjusting a mass of the additional material.

In the above described method, the additional material may be an ink applied by an ink jet printer, and the mass of the ink is preferably adjusted by the number of times the ink is applied by the ink jet printer.

In another preferred embodiment of the above described method, the additional material is preferably disposed in the range of about L/4 from each of the opposite ends of the base member in the longitudinal direction of the base member, where L is the length of the base member. Alternatively, the additional material is preferably disposed in the range of about L/2 around a central portion of the base member in the longitudinal direction of the base member, where L is the length of the base member.

In the above described method, the additional material may be a rigid material.

Another preferred embodiment of the present invention provides a piezoelectric resonator including a base member having a longitudinal direction and vibrating in a longitudinal vibration mode and an additional material is disposed as a mass load in a range of about L/4 from each of opposite ends of the base member in the longitudinal direction of the base member, where L is the length of the base member.

According to a further preferred embodiment of the present invention, a piezoelectric resonator includes a base member having a longitudinal direction and vibrating in a longitudinal vibration mode, and a rigid additional material disposed in the range of about L/2 around a substantially central portion of the base member in the longitudinal direction of the base member, where L is the length of the base member.

The preferred embodiments of the present invention further provide a communication apparatus including a detector comprising the piezoelectric resonator in accordance with any one of the preferred embodiments described above.

The preferred embodiments of the present invention further provide a communication apparatus including a band-pass filter comprising a ladder-filter including the piezoelectric resonator in accordance with any one of the preferred embodiments described above.

According to preferred embodiments of the present invention, the additional material is disposed on the piezoelectric resonator to increase or decrease the frequency of the piezoelectric resonator. If an ink jet printer or the like is used, the amount of ink applied can be controlled with accuracy, thereby enabling fine and very accurate frequency adjustment. In such a case, it is also possible to control the amount of application of ink to each of a plurality of piezoelectric resonators, which are collectively processed at the same time or during the same frequency adjustment process. Thus, accurate, high-efficiency frequency adjustment can be achieved. Further, if an ink jet printer is used, the additional material can be formed on the piezoelectric resonator in a non-contact manner, thus preventing undesirable influence of stress or heat upon the piezoelectric resonator.

Since no constituent material is removed from the resonator, in contrast with the conventional method of cutting the piezoelectric resonator, there is no influence upon characteristics other than the frequency and there is no possibility of generation of detrimental materials which might affect other characteristics of the resonator.

Further, according to preferred embodiments of the present invention, a communication apparatus using the piezoelectric resonator which is frequency-adjusted without influencing characteristics other than the frequency can be obtained.

Figure 3:
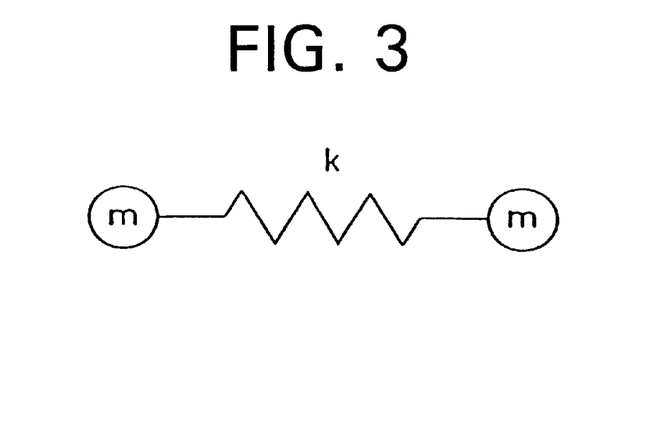
FIG. 3 is a diagram showing a spring-mass model relating to the frequency of the piezoelectric resonator shown in FIG. 1.

The frequency of the piezoelectric resonator of preferred embodiments of the present invention can be represented by a spring-mass model such as shown in FIG. 3 and is proportional to $(k/m)^{1/2}$, In this expression, m is a mass in the spring-mass model and k is a spring constant. Basically, by providing the additional material on the base member, the mass m of the spring-mass model is increased or the spring constant is increased. In this case, if the length of the base member is L, the additional material may be disposed as a mass load in the range of about L/4 from each of the opposite ends of the base member to increase m, thereby reducing the frequency of the resonator. If ink is applied by an ink jet printer for such an effect, m can be finely adjusted by the number of times of application since the amount of ink applied during each application is small. Also, the additional material having a desired rigidity may be disposed in the range of about L/2 around a substantially central portion of the base to increase k, thereby increasing the frequency of the resonator. According to this method, no constituent material of the piezoelectric resonator is removed since an additional material is disposed on the base member.

Other features and advantages of the present invention will become apparent from the following description of the invention which refers to the accompanying drawings.

DETAILED DESCRIPTION OF PREFERRED EMBODIMENTS

Figure 1:
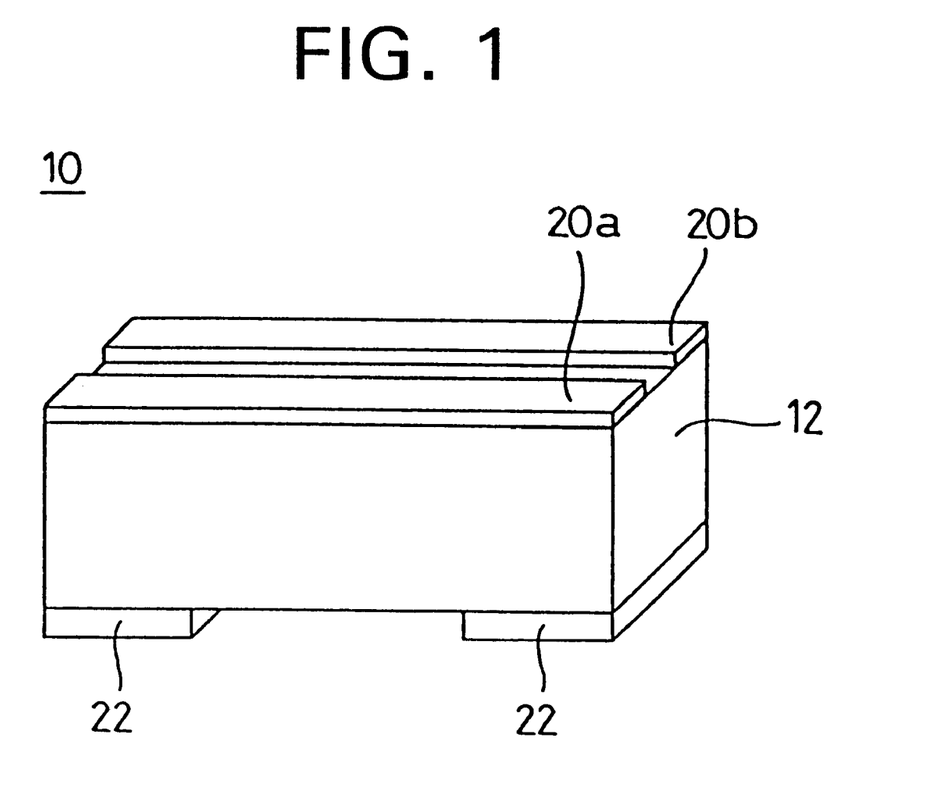
FIG. 1 is a perspective view of a preferred embodiment of a piezoelectric resonator in accordance with the present invention.
Figure 2:
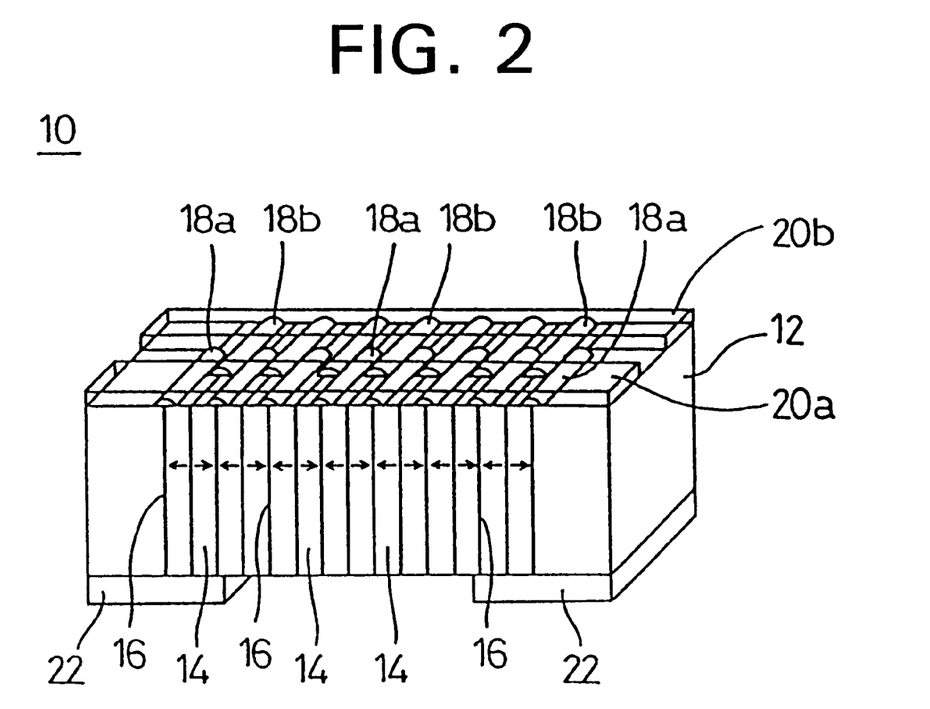
FIG. 2 is a diagram showing the structure of the piezoelectric resonator shown in FIG. 1.

Referring to FIG. 1 and FIG. 2, a piezoelectric resonator 10 includes a base member 12 in the form of a substantially rectangular block. The base member 12 is formed by laminating a plurality of piezoelectric layers 14 and a plurality of internal electrodes 16. Each adjacent pair of the piezoelectric layers 14 are polarized along the longitudinal direction of the base member 12 so that the directions of polarization are opposite from each other, as indicated by the arrows in FIG. 2. However, opposite end portions of the base member 12 are preferably not polarized. Opposite end portions of the base member 12 may be polarized if desired. The internal electrodes 16 in one of the two groups of internal electrodes 16 alternating with each other at a first side surface of the base member 12 are covered with insulating films 18a at a first ends in the width direction of the base member 12. The other group of internal electrodes 16 at the first side surface of the base member 12 not covered with insulating films 18a are covered with other insulating films 18b at second ends in the width direction of the base member 12.

Further, on the first side surface of the base member 12, an external electrode 20a is provided so as to be connected to the internal electrodes 16 at the first end of the base member 12. Since the internal electrodes 16 are alternately covered with insulating films 18a and left uncovered, the alternate internal electrodes 16 not covered with insulating films 18a are connected to the external electrode 20a. Similarly, on the first side surface of the base member 12, an external electrode 20b is provided so as to be connected to the internal electrodes 16 at the second end of the base member 12. Since the internal electrodes 16 are alternately covered with insulating films 18b and left uncovered, the alternate internal electrodes 16 not covered with insulating films 18b are connected to the external electrode 20b. Thus, each adjacent pair of internal electrodes 16 are respectively connected to the different external electrodes 20a and 20b.

On a second side surface of the base member 12 opposite to the first side surface on which the external electrodes 20a and 20b are formed, an additional material 22 is disposed preferably at the opposite ends of the base member 12 in the longitudinal direction thereof. For example, the additional material 22 is preferably formed by applying an ink via an ink jet printer.

In this piezoelectric resonator 10, electric fields are applied to the piezoelectric layers 14 by inputting a signal to the external electrodes 20a and 20b, thereby causing the piezoelectric layers 14 to expand and contract along the longitudinal direction of the base member 12. Longitudinal vibration is thereby excited throughout the piezoelectric resonator 10. The piezoelectric resonator 10 thus arranged is a stiffened type piezoelectric resonator. The frequency of this piezoelectric resonator is represented by a spring-mass model shown in FIG. 3 and is proportional to $(k/m)^{1/2}$. In this expression, m is a mass in the spring-mass model and k is a spring constant. In this piezoelectric resonator 10, the additional material 22 is formed to increase m in the spring-mass model relative to that in the case of a piezoelectric resonator having no such additional material. Correspondingly, the frequency of the piezoelectric resonator 10 is reduced relative to that of a piezoelectric resonator having no additional material.

Figure 4:
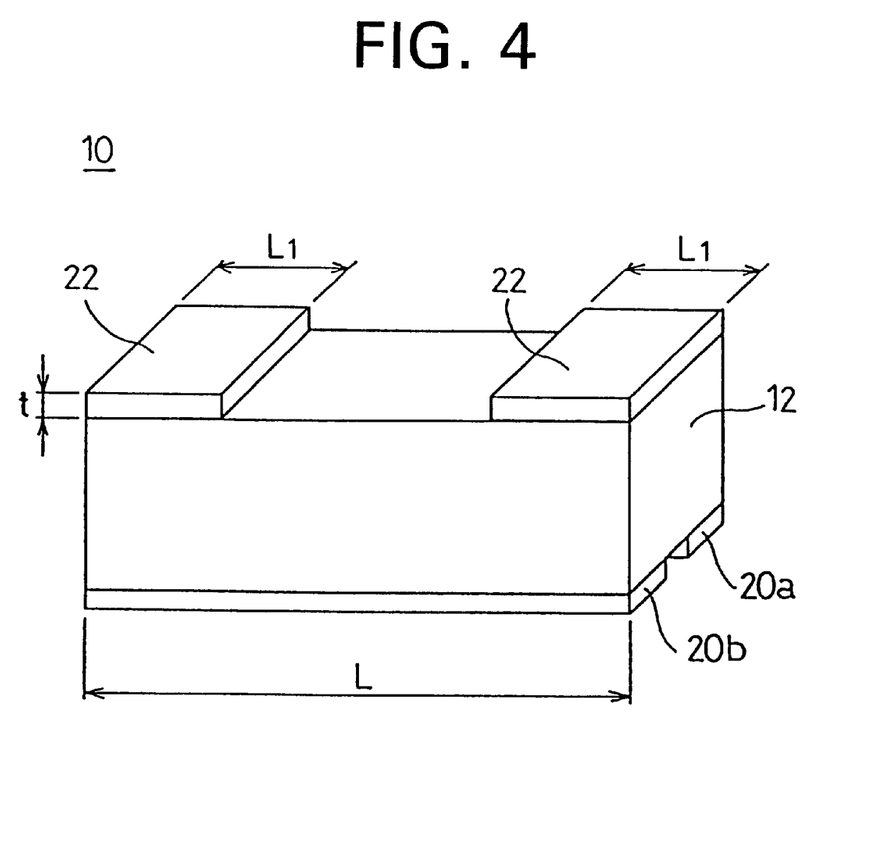
FIG. 4 is a perspective view of a piezoelectric resonator according to an experimental example.
Figure 5A:
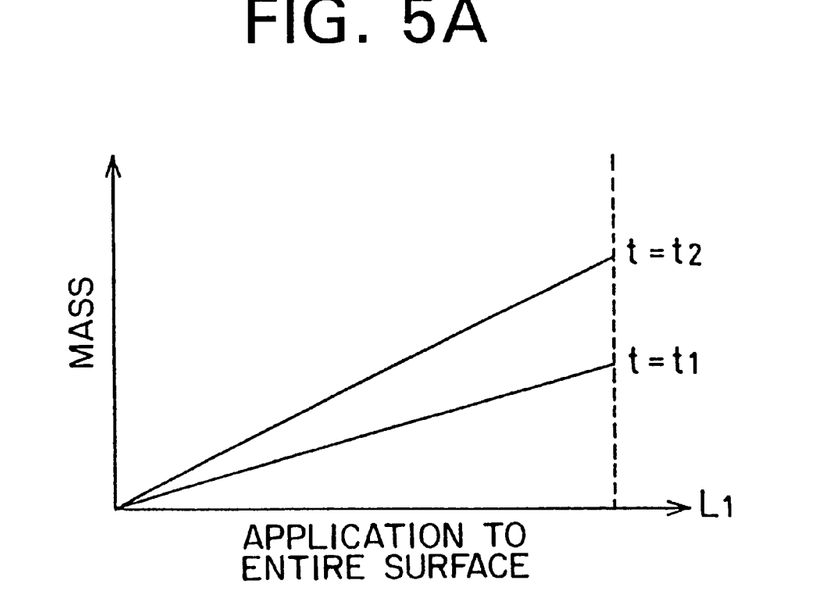
FIG. 5 comprises graphs showing the mass of an additional material and the reduction in the frequency of the piezoelectric resonator when the extent of formation of the additional material was changed.
Figure 5B:
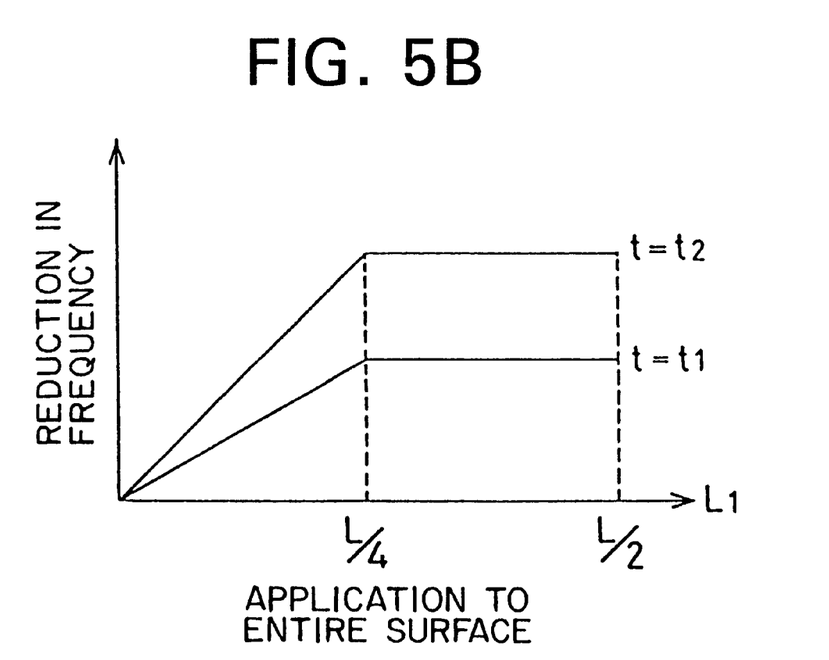

The additional material 22 is preferably applied to the base member 12 by an ink jet printer so as to set the thickness t, as seen in FIG. 4, of the additional material 22 to within a range between $t_1$ and $t_2$ ($t_1<t_2$) FIGS. 5(a) and 5(b) show the results of application of the additional material with respect to the extent of formation of additional material 22 within the range between $t_1$ and $t_2$. FIG. 5(a) shows a total mass M when the additional material 22 was disposed between the longitudinal-direction opposite ends of the base member 12 and positions at a distance $L_1$ from the opposite ends. The additional material 22 was disposed at the opposite ends of the base member 12 extending toward the center of the base member 12 so as to have a certain desired length with respect to the entire length L of the base member 12. A relation $L_1=L/2$ corresponds to the state where the additional material 22 is formed along the entire area of the second side surface of the base member 12. FIG. 5(b) shows the reduction in frequency ranging from when the additional material 22 was formed to when no additional material 22 was added.

As can be understood from FIGS. 5(a) and 5(b), the frequency was reduced when the position of the additional material 22 was within the range of about L/4 from each of the opposite ends of the base member 12, and the frequency was not substantially reduced when the additional material 22 was located in the vicinity of the center of the base member 12. This effect corresponds to an increase in m in the spring-mass model due to the formation of the additional material 22 closer to the opposite ends of the base member 12. Consequently, for frequency adjustment, it is preferred that the additional material 22 be disposed so as to be within the range of about L/4 from each of the opposite ends of the base member 12. In this case, it is not necessary to fix the shape and mass of the additional material 22 disposed at the opposite ends of the base member 12 as long as the additional material 22 is located within this range. The shape and mass of the additional material 22 may be selected according to an adjustment target frequency.

Adjustment of the mass of the additional material 22 disposed on the base member 12 can be made easier by using an ink jet printer for applying the desired amount of additional material 22. Because an ink jet printer applies a small ink droplet of about 0.1 μg or less, the mass of the additional material 22 can be finely adjusted by the number of applications of ink using the ink jet printer.

Figure 6A:
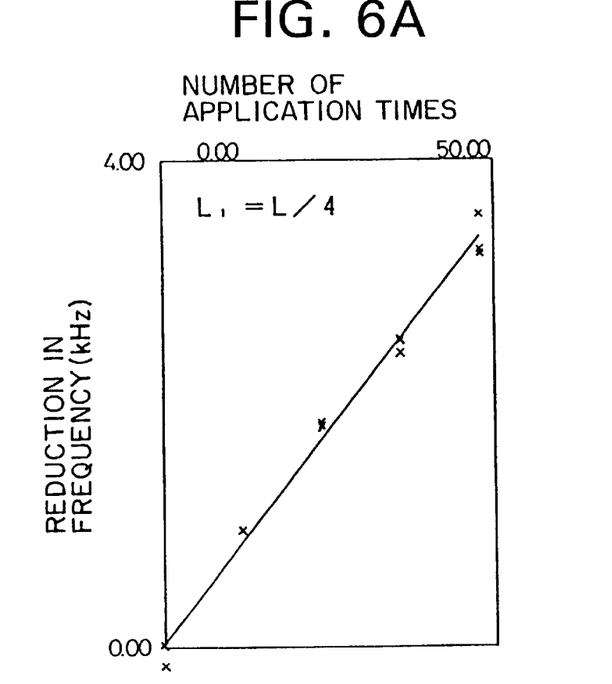
FIG. 6 comprises graphs showing the relationship between the number of times of ink application by an ink jet printer and the reduction in frequency in the piezoelectric resonator shown in FIG. 4.
Figure 6B:
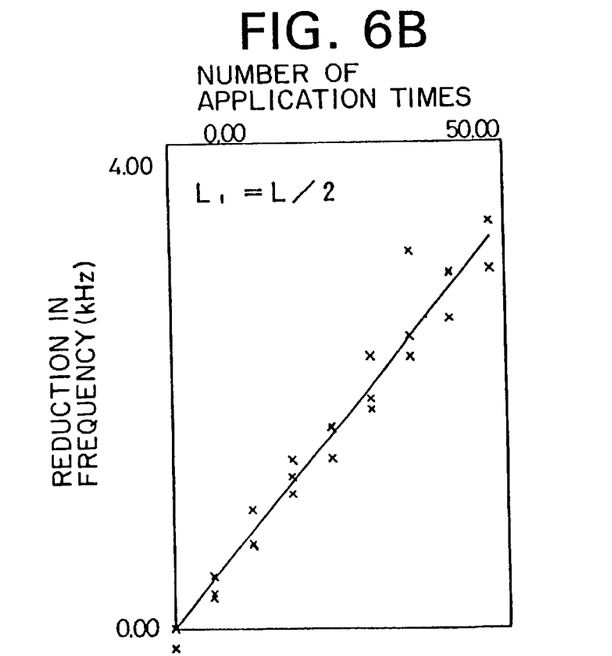

FIGS. 6(a) and 6(b) show the results of an example of preferred embodiments of the present invention detailing the relationship between the number of times ink is applied by an ink jet printer and the reduction in the frequency of the piezoelectric resonator 10. FIG. 6(a) shows an example of application of ink on one side surface of the base member 12 in the range of about L/4 from each of the opposite ends, and FIG. 6(b) shows an example of application of ink over the entire area of one side surface of the base member 12.

As can be understood from FIGS. 6(a) and 6(b), the number of times of ink application by the ink jet printer and the reduction in frequency are generally proportional to each other. Also, the characteristics shown in FIGS. 6(a) and 6(b) are similar to each other. It can also be understood therefrom that the difference between the reduction in frequency in the case where ink is applied in the range of about L/4 and the reduction in frequency in the case where ink is applied over the entire surface is small.

Thus, the reduction in the frequency of the piezoelectric resonator 10 can be accurately adjusted based on the number of times of ink application by an ink jet printer. Moreover, a plurality of piezoelectric resonators 10 can be simultaneously adjusted with respect to the reduction in frequency.

Applying ink in the range of about L/4 from each of the opposite ends of the base member 12 is extremely effective for accurate frequency adjustment. If an ink jet printer is used, the additional material 22 can be disposed on the base member 12 in a non-contact manner, thereby avoiding application of stress or frictional heat to the base member 12. Thus, such undesirable influences upon the piezoelectric resonator 10 are prevented.

Alternatively, the additional material may also comprise resin which may be applied by a thick forming method such as printing or by using an ejection apparatus such as a dispenser.

In such a preferred embodiment, a rigid additional material 22 may be disposed on the base member 12. In such a case, the additional material 22 is provided on a side surface of the base member 12 by a thick film forming method, e.g., a method of providing an insulating member for preventing contact with the internal electrodes 16, and thereafter baking a rigid metallic material, e.g., Ag. If the additional material 22 is formed in the above-described manner, the frequency of the piezoelectric resonator 10 is increased. Adding the additional material 22 corresponds to increasing k in the spring-mass model. That is, adding the additional material 22 corresponds to making the spring of the spring-mass model stronger. As a factor influencing this effect, the rigidity of the additional material 22 is more important than the mass.

Figure 7:
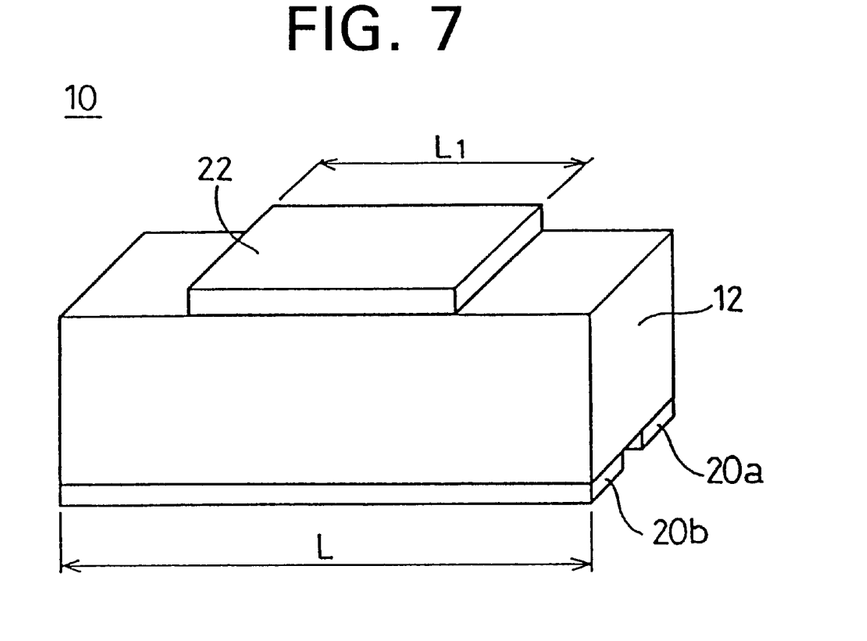
FIG. 7 is a perspective view of a preferred embodiment of the piezoelectric resonator of the present invention.
Figure 8:
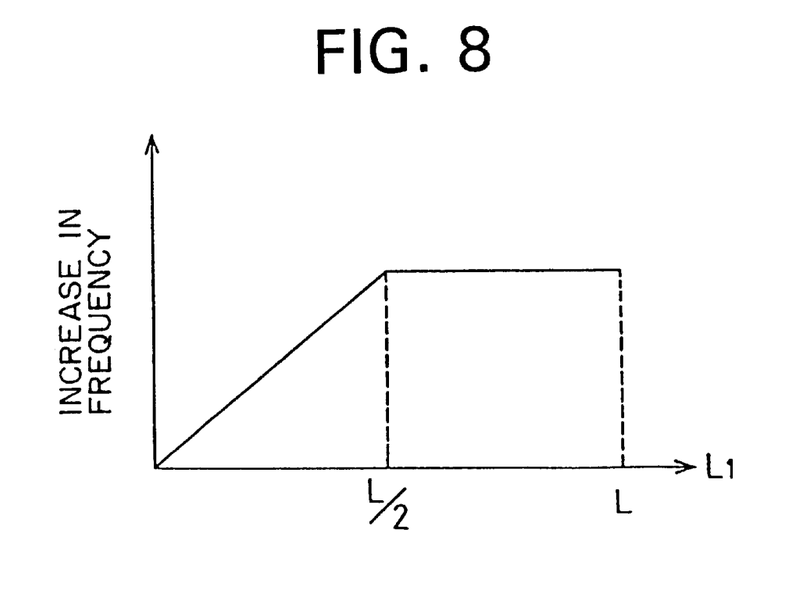
FIG. 8 is a graph showing the increase in the frequency of the piezoelectric resonator shown in FIG. 7 when the extent of formation of the additional material is changed.

For such an effect, the additional material 22 is preferably arranged to extend from the approximate center of the base member 12 toward the opposite ends in the longitudinal direction of the base, as shown in FIG. 7. FIG. 8 shows the relationship between the length $L_1$ of the additional material 22 and the increase in frequency as a result of adding the additional material 22 in such a manner. As can be understood from FIG. 8, when $L_1$ is in the range of about 0 to L/2, the frequency becomes higher with an increase in $L_1$. However, when $L_1$ exceeds about L/2, no increase in frequency is observed. Disposing rigid the additional material 22 around the approximate center of the base member 12 corresponds to checking the movement of the piezoelectric resonator 10, i.e., increasing the spring constant k in the spring-mass model. When the amount of the additional material 22 is increased at a position closer to the ends of the base member 12, an effect of increasing the mass m in the spring-mass model appears. Consequently, in increasing the frequency of the piezoelectric resonator 10, disposing the material in the range of about L/2 about the approximate center of the base member 12 is effective.

The frequency of the piezoelectric resonator 10 can be adjusted by disposing the additional material 22 on the piezoelectric resonator 10 as described above. Also, the frequency of the piezoelectric resonator 10 can be adjusted by adjusting the number of times of ink application by an ink jet printer or by selecting the range of formation of the additional material 22 such as ink or metal film.

The frequency adjustment method of preferred embodiments of the present invention is based on disposing the additional material 22 on the piezoelectric resonator 10 instead of removing the constituent materials of the piezoelectric resonator 10 defining the piezoelectric layers, internal electrodes and so on. Therefore, the method of preferred embodiments of the present invention is free from influence upon characteristics including the capacitance other than the frequency.

Figure 9:
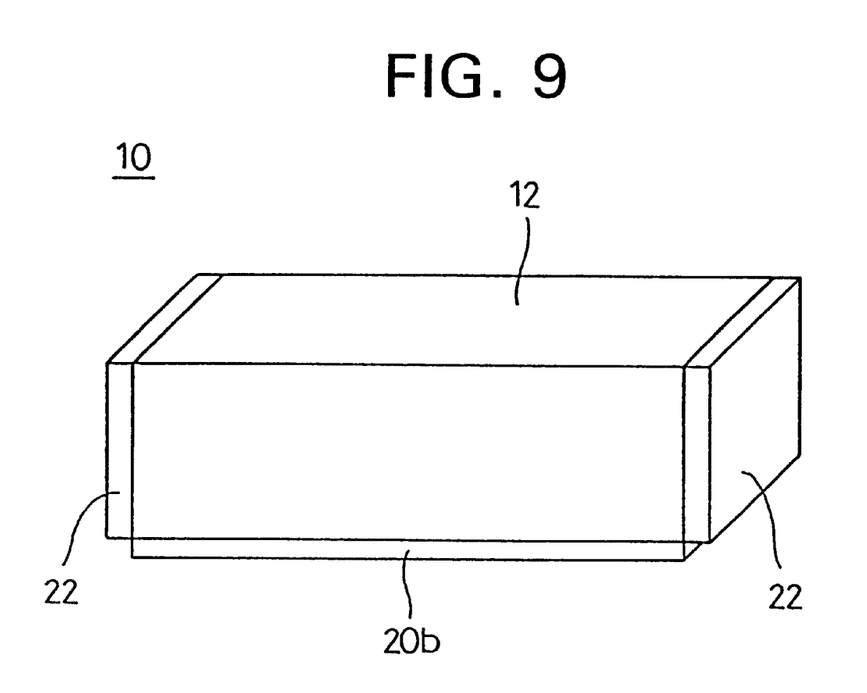
FIG. 9 is a perspective view of another preferred embodiment of a piezoelectric resonator according to the present invention.

To reduce the frequency of the piezoelectric resonator 10, the additional material 22 may be disposed on surfaces of the base member 22 at the opposite ends in the longitudinal direction, as shown in FIG. 9. The additional material 22 may be disposed on two or more side surfaces of the base member 12 instead of being disposed on only one side surface. The piezoelectric resonator 10 is not limited to the laminated type, and the additional material may be formed on a longitudinal-vibration piezoelectric resonator in which electrodes are provided on two surfaces of a piezoelectric plate as shown in FIG. 11. Thus, the frequency of a piezoelectric resonator of any construction can be adjusted by adding the additional material as described above.

Figure 10:
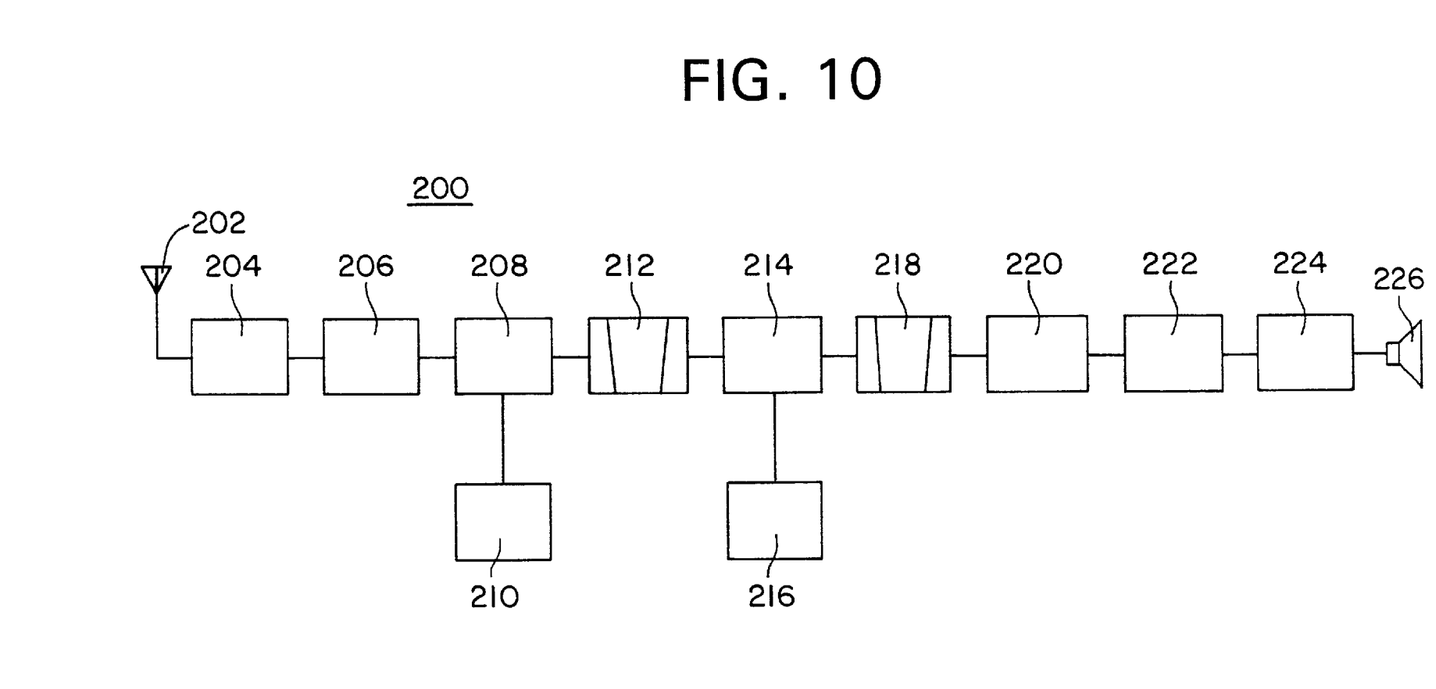
FIG. 10 is a block diagram showing one preferred embodiment of a double-super heterodyne receiver according to the present invention.

FIG. 10 is a block diagram showing a preferred embodiment of a double-super-heterodyne receiver in accordance with the present invention. The super-heterodyne receiver 200 shown in FIG. 10 includes an antenna 202. The antenna 202 is connected to an input-end of an input-circuit 204. The input-circuit 204 performs an impedance matching between the antenna 202 and a high-frequency amplifier 206 which will be described below. A tuning circuit which selects a desired frequency or a band-pass filter is used as the input-circuit 204. An output-end of the input-circuit 204 is connected to an input-end of a high-frequency amplifier 206. The high-frequency amplifier 206 is used for improving a sensitivity by low-noise amplification of weak radio waves and for improving selectivity of image-frequencies. An output-end of the high-frequency amplifier 206 is connected to an input-end of a first frequency mixer 208. The first frequency mixer 208 is used for making a first integrated or differential intermediate-frequency by mixing a desired frequency and a first local oscillation frequency. The other input-end of the first frequency mixer 208 is connected to an output-end of a first local oscillator 210. The first local oscillator 210 is used for oscillating the first local oscillation frequency to make the first intermediate-frequency. An output-end of the first frequency mixer 208 is connected to an input-end of a first band-pass filter 212. The first band-pass filter 212 is used for passing the first intermediate-frequency. An output-end of the first band-pass filter 212 is connected to one input-end of a second frequency mixer 214. The second frequency mixer 214 is used for making a second integrated or differential intermediate-frequency by mixing the first intermediate frequency and a second local oscillation frequency. The other input-end of the second frequency mixer 214 is connected to an output-end of a second local oscillator 216. The second local oscillator 216 is used for oscillating the second local oscillation frequency to generate the second intermediate-frequency. An output-end of the second frequency mixer 214 is connected to an input-end of a second band-pass filter 218. The second band-pass filter 218 is used for passing the second intermediate frequency. An output-end of the second band-pass filter 218 is connected to an input-end of an intermediate frequency amplifier 220. The intermediate frequency amplifier 220 is used for amplifying the second intermediate frequency. An output-end of the intermediate frequency amplifier 220 is connected to an input-end of a detector 222. The detector 222 is used for obtaining signal waves from the second intermediate frequency. An output-end of the second detector 222 is connected to an input-end of a low-frequency amplifier 224. The low-frequency amplifier 224 is used for amplifying the signal waves so that the signal waves can drive a speaker. An output-end of the low-frequency amplifier 224 is connected to a speaker 226.

In this preferred embodiment of the present invention, the above described piezoelectric resonator according to other preferred embodiments of the present invention can be used as the detector 222 in the double-super-heterodyne receiver 200. In addition, the above described ladder-filter can be used as each of the first band-pass filter 212 and the second band-pass filter 218.

As the ladder-filter including the piezoelectric resonator, the ladder-filter disclosed in a Japanese Patent Laid-Open publication No. 51261/1998 for example may be used. In the ladder-filter, four piezoelectric resonators are connected to each other in a ladder configuration. Such a receiver 200 has a very small size and yet still achieves excellent receiving characteristics.

In preferred embodiments of the present invention, the above described piezoelectric resonator can be used as a detector in a single-super-heterodyne receiver. Further, the above described ladder-filter can be used as a band-pass filter.

Similar to the above-described double-super-heterodyne receiver, such a single-super-heterodyne receiver also has a very small size and achieves excellent receiving characteristics.

While the invention has been particularly shown and described with reference to preferred embodiments thereof, it will be understood by those skilled in the art that the forgoing and other changes in form and details may be made therein without departing from the spirit of the invention.

What is claimed is:

1. A method for increasing a frequency of a piezoelectric resonator, comprising the steps of:

providing a piezoelectric resonator adapted to be vibrated in a longitudinal vibration mode and including a base member having a longitudinal direction; and increasing a resonant frequency of said piezoelectric resonator by disposing an additional rigid material on said base member;

wherein said additional rigid material is disposed in a range of about L/2 from a central portion of said base member in the longitudinal direction of said base member, where L is the length of said base member.

2. The method according to claim 1, further comprising the step of adjusting a mass of the additional material.

3. The method according to claim 1, wherein said additional material is an ink applied by an ink jet printer.

4. The method according to claim 3, wherein a mass of said ink is adjusted by a number of ink application steps in which the ink is applied by said ink jet printer.

5. A method according to claim 1, wherein said step of adjusting the frequency of said piezoelectric resonator includes the steps of disposing the additional material on said base member a plurality of times.

6. A method according to claim 1, wherein said piezoelectric resonator includes external electrodes disposed on a first surface thereof and said additional material is applied to a second surface of said piezoelectric resonator which is opposite to said first surface.

7. A piezoelectric resonator, comprising:

a base member having a longitudinal direction and adapted to be vibrated in a longitudinal vibration mode; and an additional rigid material disposed in a range of about L/2 from a central portion of said base member in the longitudinal direction of said base member, where L is the length of said base member;

wherein said additional rigid material is arranged on the base member so as to increase a resonant frequency of said piezoelectric resonator.

8. A communication apparatus including a detector, wherein said detector comprises a piezoelectric resonator including:

a base member having a longitudinal direction and adapted to be vibrated in a longitudinal vibration mode; and an additional rigid material arranged on said piezoelectric resonator so as to increase a resonant frequency of said piezoelectric resonator;

wherein said additional material is disposed in a range of about L/2 from a central portion of said base member in the longitudinal direction of said base member, where L is the length of said base member.

9. A communication apparatus including a band-pass filter, wherein said band-pass filter comprises a ladder-filter including:

a base member having a longitudinal direction and adapted to be vibrated in a longitudinal vibration mode; and an additional rigid material arranged on said piezoelectric resonator so as to increase a resonant frequency of said piezoelectric resonator;

wherein said additional material is disposed in a range of about L/2 from a central portion of said base member in the longitudinal direction of said base member, where L is the length of said base member.

* * * * *